(12) United States Patent
Kim et al.

(10) Patent No.: US 12,184,265 B2
(45) Date of Patent: Dec. 31, 2024

(54) RESONATOR PACKAGE AND METHOD OF MANUFACTURING THE SAME

(71) Applicant: SAMSUNG ELECTRO-MECHANICS CO., LTD., Suwon-si (KR)

(72) Inventors: Tae Yoon Kim, Suwon-si (KR); Yeong Gyu Lee, Suwon-si (KR); Moon Chul Lee, Suwon-si (KR); Jae Chang Lee, Suwon-si (KR); Duck Hwan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 1153 days.

(21) Appl. No.: 16/292,715

(22) Filed: Mar. 5, 2019

(65) Prior Publication Data

US 2019/0199319 A1    Jun. 27, 2019

Related U.S. Application Data

(62) Division of application No. 15/058,713, filed on Mar. 2, 2016, now Pat. No. 10,367,471.

(30) Foreign Application Priority Data

May 21, 2015   (KR) .................. 10-2015-0070825
Sep. 8, 2015   (KR) .................. 10-2015-0126960

(51) Int. Cl.
*H03H 3/02* (2006.01)
*H03H 9/10* (2006.01)
*H03H 9/13* (2006.01)

(52) U.S. Cl.
CPC .............. *H03H 9/131* (2013.01); *H03H 3/02* (2013.01); *H03H 9/1007* (2013.01); *Y10T 29/42* (2015.01)

(58) Field of Classification Search
CPC .... H01L 28/40–92; H03H 3/02; H03K 9/131; Y10T 29/42
See application file for complete search history.

(56) References Cited

U.S. PATENT DOCUMENTS 7,612,488 B1 *  11/2009  Bouche .................. H03H 9/589
                                                         310/365
2002/0028582 A1 *  3/2002  Nallan ............... H01L 21/32136
                                                         257/E21.311

(Continued)

FOREIGN PATENT DOCUMENTS

CN         1595798 A       3/2005
CN         1757158 A       4/2006

(Continued)

OTHER PUBLICATIONS

Chinese Office Action issued on Apr. 29, 2020 in corresponding Chinese Patent Application No. 201610168833.8 (12 pages in English, 9 pages in Chinese).

(Continued)

*Primary Examiner* — Livius R. Cazan
(74) *Attorney, Agent, or Firm* — NSIP Law

(57) ABSTRACT

A resonator package and a method of manufacturing the same are provided. The method of manufacturing a resonator package involves etching a lower electrode with a hardmask, in which only a portion of a thickness of the lower electrode is etched to shape the lower electrode.

13 Claims, 11 Drawing Sheets

(56) References Cited

U.S. PATENT DOCUMENTS

| | | | |
|---|---|---|---|
| 2003/0059989 A1 | 3/2003 | Yudasaka et al. | |
| 2003/0128081 A1 | 7/2003 | Ella et al. | |
| 2005/0052261 A1 | 3/2005 | Yoon et al. | |
| 2005/0248232 A1* | 11/2005 | Itaya | H03H 3/02 310/320 |
| 2006/0226932 A1 | 10/2006 | Fazzio et al. | |
| 2007/0194662 A1* | 8/2007 | Sano | H03H 9/564 310/324 |
| 2007/0202704 A1* | 8/2007 | Shin | H01L 21/32136 257/E21.311 |
| 2007/0247260 A1 | 10/2007 | Yanase et al. | |
| 2007/0249260 A1 | 10/2007 | Bapst et al. | |
| 2008/0060181 A1 | 3/2008 | Fazzio et al. | |
| 2008/0153248 A1* | 6/2008 | Hwang | H01L 21/32136 257/E21.011 |
| 2010/0036518 A1 | 2/2010 | Funk et al. | |
| 2010/0237750 A1 | 9/2010 | Sakashita et al. | |

FOREIGN PATENT DOCUMENTS

| | | | | |
|---|---|---|---|---|
| EP | 1 615 339 A1 | | 1/2006 | |
| JP | 2003-519919 A | | 6/2003 | |
| JP | 2006005218 A | * | 1/2006 | |
| JP | 2010-41051 A | | 2/2010 | |
| JP | 4688070 B2 | * | 5/2011 | H03H 3/02 |
| JP | 4944145 B2 | | 5/2012 | |
| KR | 2002-0006364 A | | 1/2002 | |
| KR | 10-2004-0026768 A | | 4/2004 | |
| KR | 10-2004-0079412 A | | 9/2004 | |
| KR | 10-2006-0107323 A | | 10/2006 | |
| KR | 2010128820 A | * | 12/2010 | H01L 41/08 |
| WO | WO 03/058809 A2 | | 7/2003 | |
| WO | WO 01/50516 A1 | | 7/2007 | |

OTHER PUBLICATIONS

Li et al., "Design of film bulk acoustic wave resonator," Journal of Functional Materials and Devices, vol. 12, No. 5, Oct. 31, 2006, 5 pages.

Selimovic et al., "Enhanced Electromagnetic Modeling of Bulk Acoustic Wave Resonators and Filters," 2011 IEEE Mtt-S International Microwave Symposium, full text, Dec. 31, 2011, 4 pages.

Korean Office Action issued on Dec. 19, 2016, in counterpart Koran Application No. 10-2015-0126960 (6 pages in English, 5 pages in Korean).

Korean Office Action issued on Jun. 21, 2017 in corresponding Korean Patent Application No. 10-2015-0126960 (7 pages in English and 6 pages in Korean).

* cited by examiner

C

RESONATOR PACKAGE AND METHOD OF MANUFACTURING THE SAME

CROSS-REFERENCE TO RELATED APPLICATIONS

This application is a division of application Ser. No. 15/058,713 filed on Mar. 2, 2016, now U.S. Pat. No. 10,367,471 issued on Jul. 30, 2019, and claims the benefit under 35 USC 119(a) of Korean Patent Application Nos. 10-2015-0070825 and 10-2015-0126960 filed respectively on May 21, 2015, and Sep. 8, 2015, in the Korean Intellectual Property Office, the entire disclosures of which are incorporated herein by reference for all purposes.

BACKGROUND

1. Field

The following description relates to a resonator package and a method of manufacturing the same.

2. Description of Related Art

Due to the rapid development of mobile communications devices, the demand for subminiature filters, oscillators, and the like, has recently increased. To implement subminiature filters, oscillators, and the like, a bulk acoustic wave (BAW) resonator may be used.

BAW resonators are often used because BAW resonators may be mass-produced at a low price and may be subminiaturized. Further, BAW resonators can be used to obtain an excellent quality factor (Q factor), a main property of filters, and may be used in a micro-frequency band.

In configuring a filter with a BAW resonator, a capacitor structure is often included in a chip circuit.

A BAW resonator generally includes a lower electrode, a piezoelectric layer, and an upper electrode, and the capacitor includes a lower electrode, a dielectric layer, and an upper electrode. In this case, in order to simplify the manufacturing process and to reduce the material cost, the upper electrode of the resonator and the lower electrode of the capacitor are manufactured from the same material during the same process.

A structure of an existing resonator package described above will be described on the basis of the capacitor. Referring to FIGS. 1 through 4E, a resonator package includes an upper electrode 10', a lower electrode 20', a dielectric layer 30', a piezoelectric layer 40', and an insulating layer 50'. This structure is explicitly illustrated in FIG. 4E.

However, the lower electrode 20' deposited on the piezoelectric layer 40' of the resonator often uses a metal such as ruthenium (Ru) in order to secure crystallinity of the piezoelectric layer 40'. Patterning of the ruthenium (Ru) metal may be often performed via a dry etching using a hardmask HM such as an oxide.

In this case, because the lower electrode 20' of the capacitor is patterned with a dry etching process using the hardmask HM, a reverse slope (RS) is easily generated on a short side of the lower electrode 20'. That is, because a gas G2 for etching the lower electrode 20' may not etch the hardmask HM, an upper end portion of the lower electrode 20' adjacent to the hardmask HM may not be etched and only a lower end portion of the lower electrode 20' may be etched, such that a reverse slope (RS) is formed by the lower end portion being etched to a greater degree.

As a result, because coverage of the dielectric layer 30' formed on an upper surface of the lower electrode 20' of the capacitor may fail. Thus, a short circuit may occur between the upper electrode 10', and the lower electrode 20' of the upper electrode 10' may fail.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a resonator package involves etching a lower electrode with a hardmask, in which only a portion of a thickness of the lower electrode is etched to shape the lower electrode.

The lower electrode may be etched at least twice with the hardmask patterned into at least two shapes.

The etching of the lower electrode may involve performing a first hardmask etching process on the hardmask provided on one surface of the lower electrode to obtain a first etched hardmask; performing a first electrode etching process on the lower electrode using the first etched hardmask such that only a portion of an overall thickness of the lower electrode is etched; performing a second hardmask etching process on the first etched hardmask to obtain a second etched hardmask; and performing a second electrode etching process on the first etched lower electrode using the second etched hardmask.

The performing of the first hardmask etching process on the hardmask and the performing of the second hardmask etching process on the first etched hardmask may be performed using a first etching gas that does not etch the lower electrode and etches only the hardmask.

The first electrode etching process and the second electrode etching process may be performed using a second etching gas that does not etch the hardmask and etches only the lower electrode.

During the first hardmask etching process and the second hardmask etching process, the hardmask may be patterned by a soft mask provided on the hardmask.

In another general aspect, a resonator package includes a lower electrode disposed on a first surface of a piezoelectric layer, an insulating layer being disposed on a second surface of the piezoelectric layer, and the lower electrode having at least two portions with different thicknesses; a dielectric layer disposed on the lower electrode; and an upper electrode provided on the dielectric layer.

The lower electrode may have a step portion having a step shape along one end portion thereof.

The lower electrode may have a normal slope disposed on one end portion thereof.

In another general aspect, a resonator package includes a piezoelectric layer, a lower electrode, a dielectric layer, and an upper electrode disposed in that order, in which the lower electrode has a smaller area than the piezoelectric layer in a plan view, and an edge of the lower electrode includes at least two portions with different thicknesses.

The edge of the lower electrode may include a step portion, and the dielectric layer may cover the step portion of the lower electrode.

The edge of the lower electrode may include a step portion and a sloped portion, and the dielectric layer may include a corresponding sloped portion above the sloped portion of the lower electrode.

The step portion and the sloped portion of the lower electrode may be obtained by at least two electrode etching processes.

In another general aspect, a method of manufacturing a resonator package involves etching a first metal layer disposed on a piezoelectric layer according to at least two shapes to obtain a first electrode, and forming a dielectric layer on the first electrode, and the dielectric layer covers a sidewall of the first electrode, The sidewall of the first electrode may form an obtuse angle with an upper surface of the first electrode.

The first electrode may include a first sidewall and a second sidewall along an edge of the first electrode, the first sidewall corresponding to a step portion and the second sidewall corresponding to a sloped portion forming an obtuse angle with an upper surface of the first electrode.

During the etching of the first metal layer, the first metal layer may be etched by performing at least two dry etching operations with a hardmask patterned in at least two different shapes.

Other features and aspects will be apparent from the following detailed description, the drawings, and the claims.

Figure 1:
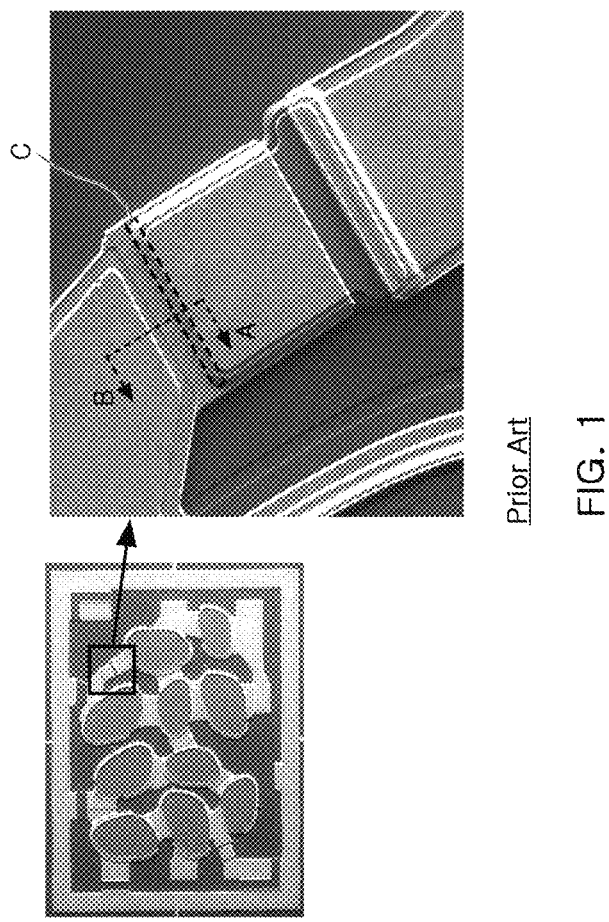
FIGS. 1 through 3 are images of a resonator package according to the related art, where a short circuit occurring between an upper electrode and a lower electrode, and a coverage failure of the upper electrode are illustrated.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on an orientation of the figures. The device may be otherwise oriented (rotated 90 degrees or at other orientations) and the spatially relative descriptors used herein may be interpreted accordingly.

The terminology used herein is for describing embodiments and is not intended to be limiting of the present description. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, various embodiments of the present description will be described with reference to schematic views. In the drawings, for example, due to manufacturing techniques and/or tolerances, modifications of the shape shown may be estimated. Thus, embodiments of the present description should not be construed as being limited to the shapes of regions shown herein, for example, to include a change in shape results in manufacturing. The following embodiments may also be constituted by one or a combination thereof.

The contents of the present description described below may have a variety of configurations and propose only a required configuration herein, but are not limited thereto.

A resonator package and a method for manufacturing the same according to the present description are suggested to prevent a short circuit from occurring between an upper electrode 10 of a capacitor and a lower electrode 20 thereof and a coverage failure of the upper electrode 10 from occurring.

According to one example of the present description, the resonator package may include a piezoelectric layer 40 and a lower electrode 20. An insulating layer 50 may be formed on one surface of the piezoelectric layer 40, and the lower electrode 20 may be formed on another surface of the piezoelectric layer 40. The lower electrode 20 may include at least two portions that have a different thickness from each other. A dielectric layer 30 may be provided on another surface of the lower electrode 20 opposite from the surface on which the piezoelectric layer 40 is provided. An upper electrode 10 may be provided on a surface of the dielectric layer 30 opposite from the surface on which the lower electrode 20 is provided.

The lower electrode 20 of a resonator package may further have at least one step portion having a step shape and a shape of a normal slope formed on one end portion thereof.

In other words, the resonator package may include the upper electrode 10, the lower electrode 20, the dielectric layer 30 positioned between the upper electrode 10 and the lower electrode 20, the piezoelectric layer 40 formed below the lower electrode 20, while the dielectric layer 20 is provided above the lower electrode 20, and the insulating layer 50 formed under the piezoelectric layer 40, the lower electrode 20 being provided above the piezoelectric layer 40. The lower electrode 20 may be formed to include at least one of a portion having a stepped shape and a portion having a normal slope shape on one end portion thereof.

In this example, the upper electrode 10 may be formed of copper (Cu), titanium (Ti), or the like, and the lower electrode 20 may be formed of ruthenium (Ru), or the like.

Further, the upper electrode 10 and the lower electrode 20 may be electrically connected to an electrode wiring pattern. The electrode wiring pattern may extend to a lower portion of a substrate, and an electrode pad may be provided on the electrode wiring pattern of the lower portion of the substrate.

Because a transition zone in which a thickness of the lower electrode 20 is gradually decreased is provided by performing two or more etching operations to form the lower electrode 20, an occurrence of a reverse slope may be prevented, thereby preventing a situation in which the dielectric layer 30 does not continuously cover the lower electrode due to an occurrence of a coverage failure (Cf) of the dielectric layer 30. As a result, when the upper electrode 10 is formed on one surface of the dielectric layer 30, a situation in which a short circuit S occurs due to a physical contact between the upper electrode 10 with the lower electrode 20 provided on the other surface of the dielectric layer 30 may be prevented.

As a result, the coverage failure (Cf) of the upper electrode 10 may also be prevented, thereby providing a resonator package having excellent quality.

Figure 2:
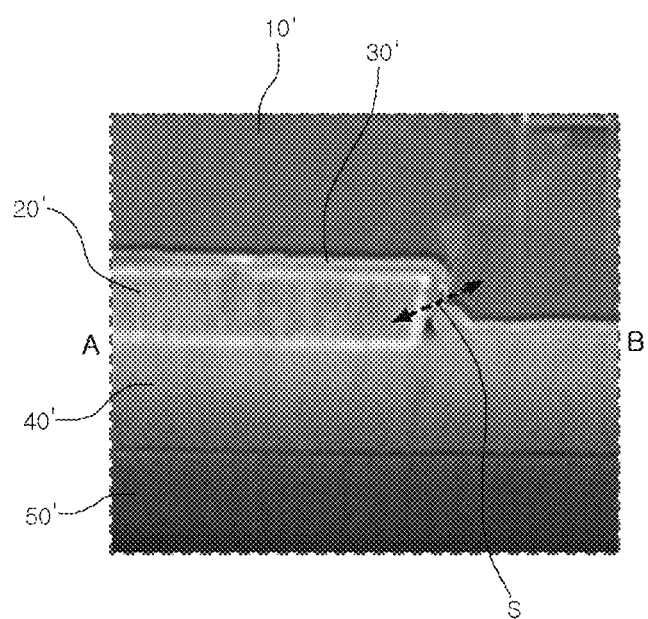

Referring to FIGS. 1 through 4E, in a resonator package obtained without performing the method described above, a resonator package may be obtained by patterning a lower electrode 20' with a single dry etching process using a hardmask HM. During the single dry etching process, a reverse slope (RS) often occurs on a short side of the lower electrode 20', as illustrated in FIG. 2.

The reverse slope is generated because a gas G2 for etching the lower electrode 20' cannot etch the hardmask HM, and an upper end portion of the lower electrode 20' adjacent to the hardmask HM is therefore protected from etching. In the meanwhile, a lower end portion of the lower electrode 20' is etched by exposure to the gas G2, causing a reverse slope (RS) to form in which the portion close to the lower surface is etched to a greater degree.

Figure 3:
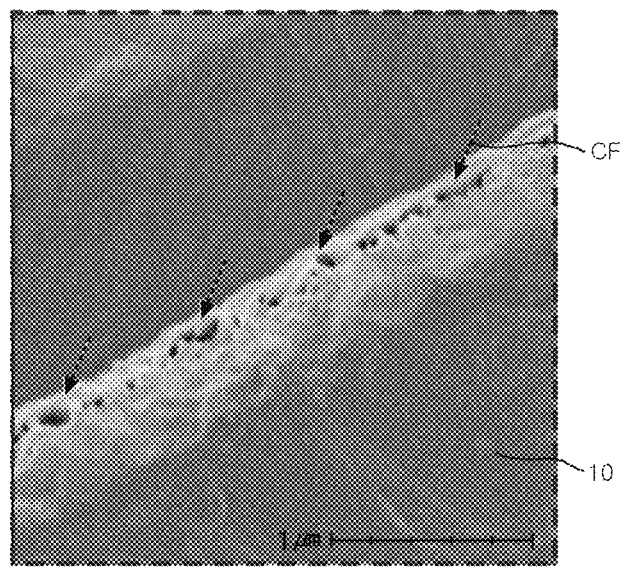
Figure 4A:
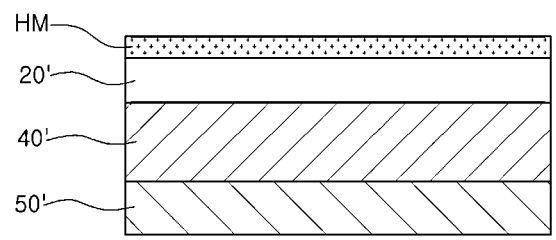
FIGS. 4A through 4E illustrate a method for manufacturing a resonator package according to the related art.
Figure 4B:
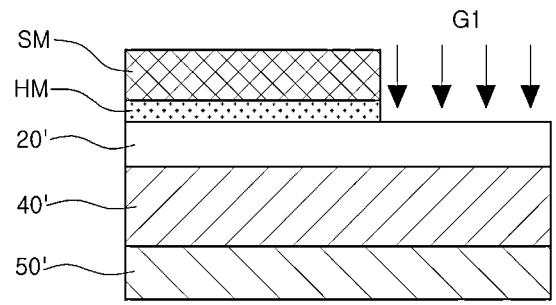
Figure 4C:
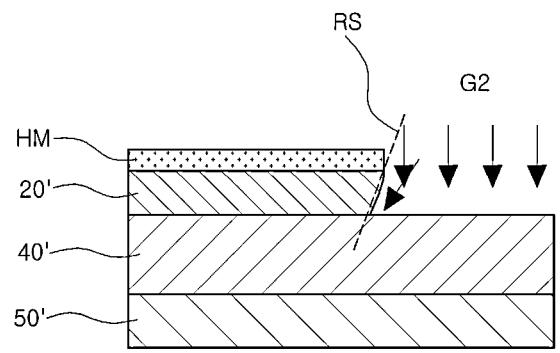
Figure 4D:
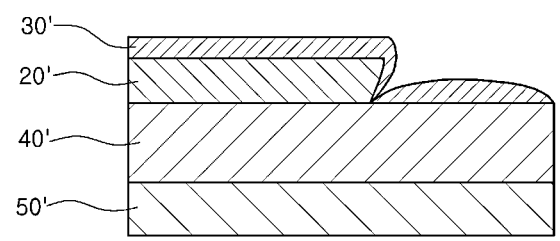
Figure 4E:
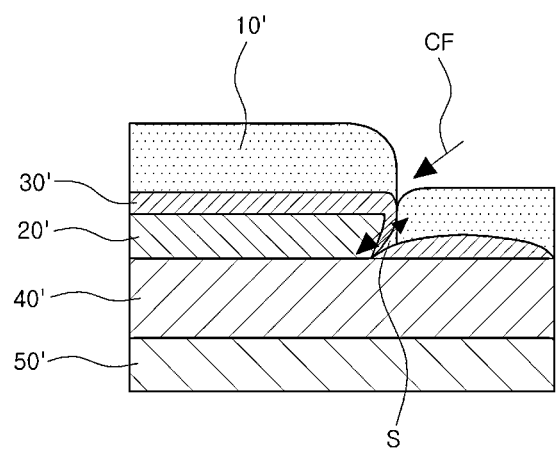

This may form a discontinuous portion upon forming a dielectric layer 30' on an upper surface of the lower electrode 20', thereby causing the dielectric coverage to fail at various locations along an edge portion of the lower electrode 20', as illustrated in FIG. 3.

Thus, after the upper electrode 10' is formed on an upper surface of the dielectric layer 30', a portion of the upper electrode 10' may be formed in a discontinuous manner. Thus, the upper electrode 10' may be connected to the lower electrode 20' due to the failure of the dielectric layer 30' to provide sufficient insulation, thereby causing a short circuit, and a coverage failure of the upper electrode 10'.

However, according to an example of the present description, a thickness of at least a portion of the lower electrode 20 may be different from those of other portions of the lower electrode 20, thereby preventing the reverse slope from being formed on the lower electrode 20. As a result, the coverage failure of the dielectric layer 30 and the upper electrode 10 may be prevented, and the formation of short circuits between the upper electrode 10 and the lower electrode 20 may be prevented.

Figure 5A:
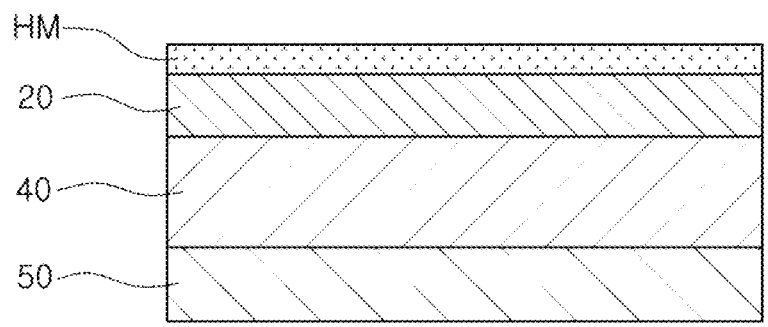
FIGS. 5A through 5G are diagrams illustrating an example of a method of manufacturing a resonator package.

As an example of a shape of the lower electrode 20 as described above, the reverse slope may be prevented from being formed on one end portion of the lower electrode 20, and a shape of a normal slope may be formed on one end portion of the lower electrode 20. Herein, a normal slope refers to a slope that forms an obtuse angle between 90° and 180° with an upper edge of the lower electrode 20, as illustrated in FIG. 5E. For example, a substantial portion of the edge of the lower electrode 20 may include a sidewall that forms an angle of approximately 95° and 160° with the upper surface of the lower electrode 20. On the other hand, a reverse slope refers to a slope formed by an upper edge of the lower electrode 20 having an acute angle of less than 90°. A sidewall having a reverse slope forms an angle of less than 90° with the piezoelectric layer 40', increasing the chance that a dielectric material that forms the dielectric layer 30' may not fully fill the narrow space. Thus, a gap may be created in the dielectric layer 30'. After the upper electrode 20' is formed, such a gap may become a location in which a short circuit S occurs, as illustrated in FIG. 2.

As another shape of the lower electrode 20, a step portion SP having a step shape may also be formed on one end portion of the lower electrode 20. Referring to FIG. 5F, the step portion SP refers to a portion where a sidewall of the lower electrode 20 forms approximately a right angle, or 90°, with an upper surface of the lower electrode 20. For example, a portion of the sidewall may have an angle in the range of approximately 85 to 95°.

Figure 6:
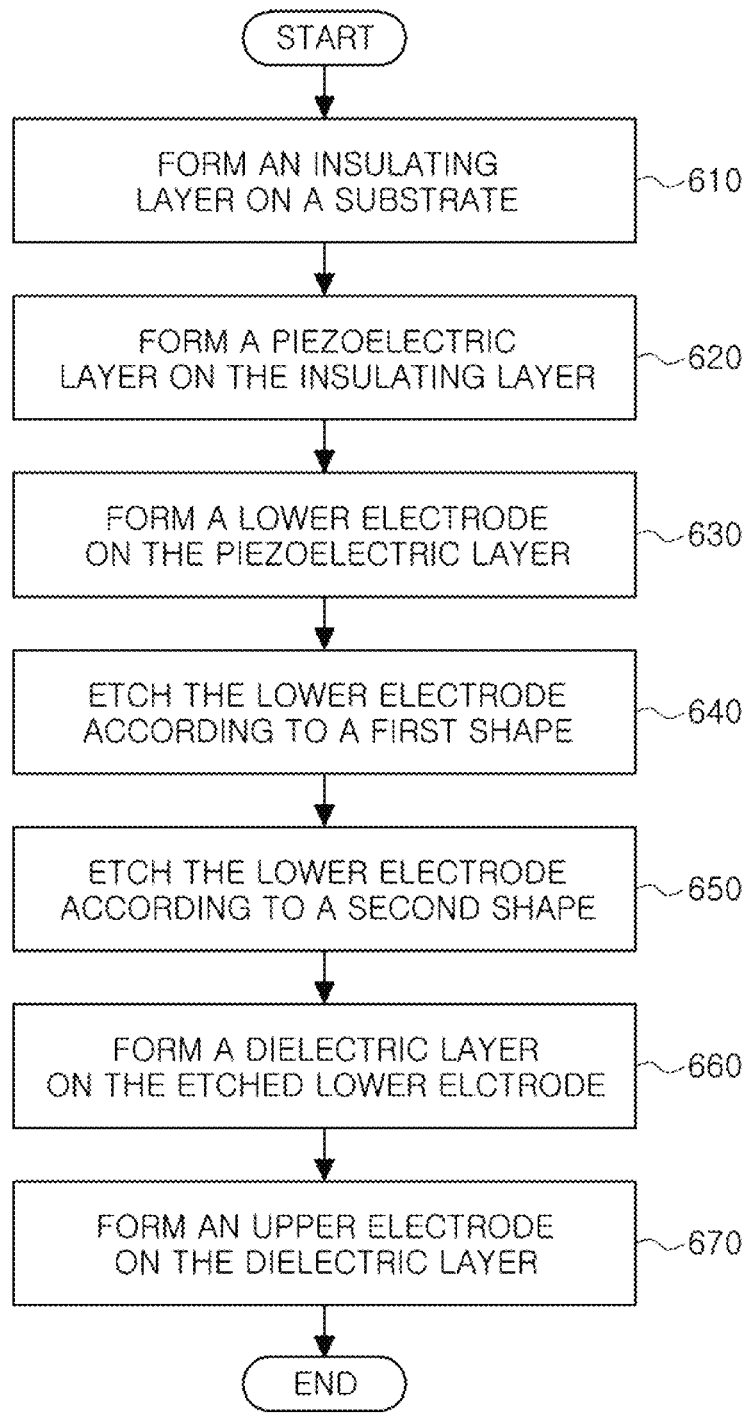
FIG. 6 is a flowchart illustrating an example of a method of manufacturing a resonator package.

Referring to FIG. 6, an example of a method of manufacturing a resonator package is illustrated.

In 610, to form a resonator package, an insulating layer 50 is formed on a substrate. The insulating layer 50 may be formed by depositing silicon dioxide (SiO$_2$) or aluminum oxide (Al$_2$O$_2$) on the substrate using a chemical vapor deposition method, an RF magnetron sputtering method, or an evaporation method.

In 620, a piezoelectric layer 40 is formed on the insulating layer 50. The piezoelectric layer 40, which is a portion generating a piezoelectric effect by converting electrical energy into acoustic wave type mechanical energy, may be formed of aluminum nitride (AlN), zinc oxide (ZnO), lead zirconium titanium oxide (PZT; PbZrTiO), or the like.

The piezoelectric layer 40 may filter a radio signal of a specific frequency using the piezoelectric effect.

In addition, in the example of the method of manufacturing the resonator package, the lower electrode 20 is etched according to at least two different shapes in 640 and 650. The lower electrode 20 may be etched by the hardmask HM, wherein only a portion of a thickness of the lower electrode 20 may be etched during a formation of the lower electrode 20, as illustrated in FIG. 5C.

In this example, the lower electrode 20 may be formed to be etched in at least two separate operations by the hardmask HM patterned into at least two shapes using different soft masks SM1, SM2.

Figure 5B:
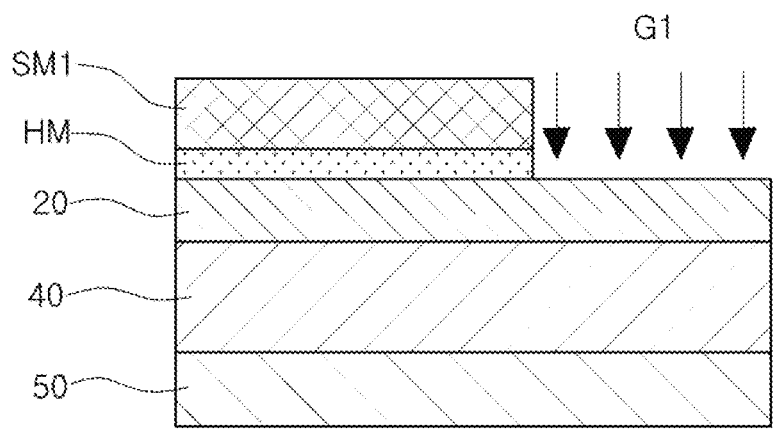
Figure 5C:
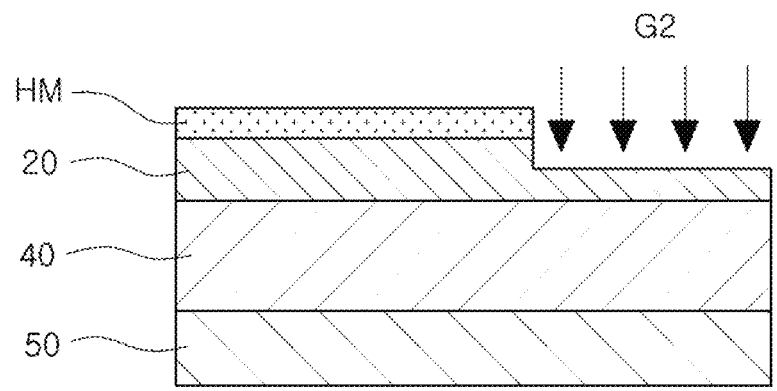
Figure 5D:
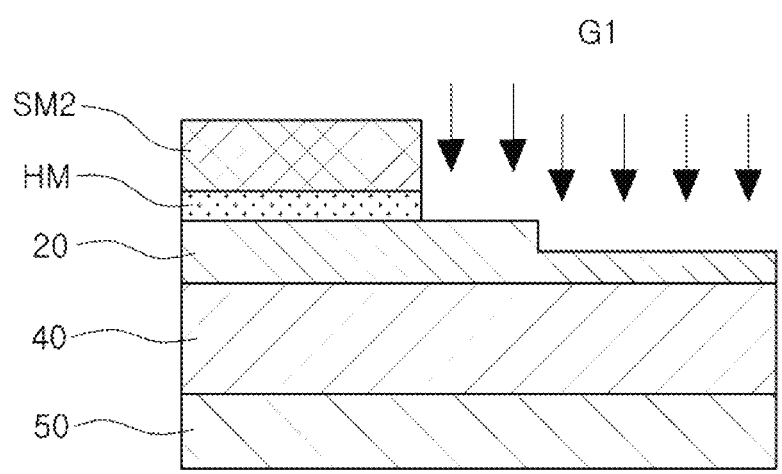
Figure 5E:
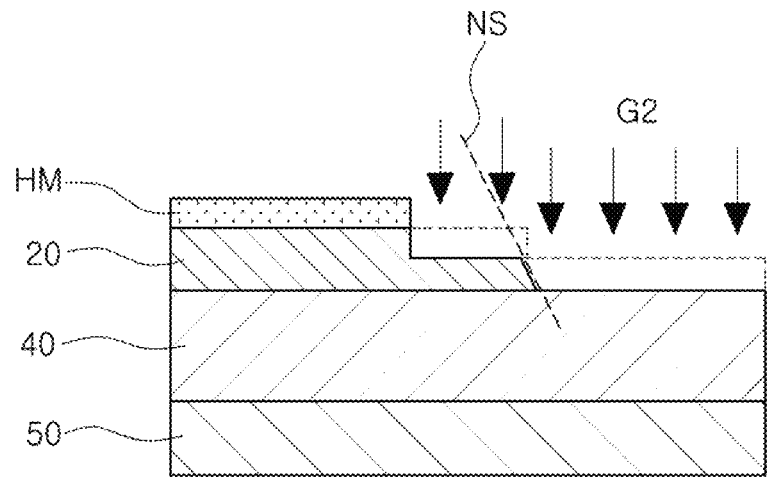
Figure 5F:
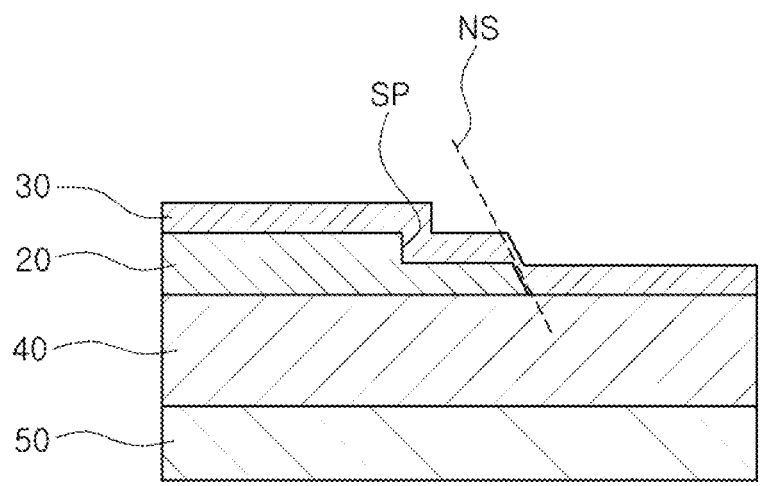

Referring to the example illustrated in FIGS. 5B through 5E, the example of the method of manufacturing the resonator package may include a first etching operation using a hardmask HM shaped according to a first soft mask SM1 provided on one surface of the lower electrode 20 (FIG. 5B), a first etching operation of the lower electrode 20 using the first etched hardmask HM after the first etching of the hardmask HM based on the first soft mask SM1. Referring to FIG. 5C, the first etching operation of the lower electrode 20 only etches a portion of an overall thickness of the lower electrode 20. However, the present description is not limited thereto. Referring to FIG. 5D, after the first etching of the lower electrode 20, the hardmask HM is shaped into a second shape by using a second soft mask SM2 during a second etching operation of the hardmask HM. Referring to FIG. 5E, a second etching operation of the lower electrode 20 is performed on the first etched lower electrode 20 using the second etched hardmask HM after the second etching of the hardmask HM.

As such, an example of a method for manufacturing the resonator package according to the present description involves patterning the lower electrode 20 with two or more dry etching processes, which may include the first etching operation of the hardmask HM based on a first soft mask SM1, the first etching operation of the lower electrode 20 performed using the first etched hardmask HM after removing the first soft mask SM1 such that a step portion having a step shape is etching only through a portion of the overall thickness of the lower electrode 20, the second etching operation of the hardmask HM performed using a second soft mask SM2 after the first etching operation of the lower electrode 20, and the second etching operation of the lower electrode 20 performed by removing the second soft mask SM2 and using the second patterned hardmask HM after the second etching operation of the hardmask HM.

In this example, two etching operations are performed on the lower electrode 20. However, in another example, more than two separate etching operations may be performed on the lower electrode 20. For example, in another example, three, four, five or more etching operations may be performed on the lower electrode 20.

A plurality of etching operation is performed for the following reason. According to the related art, the gas G2 for etching the lower electrode 20' may not etch the hardmask HM. Thus, because the etching gas G2 collides with and is reflected by the piezoelectric layer 40', the upper end portion of the lower electrode 20' adjacent to the hardmask HM is protected by the hardmask HM and is not etched and only the lower end portion of the lower electrode 20' is etched. Thus, a reverse slope occurs in which the lower portion of the lower electrode 20' is etched to a greater degree. Thus, the two or more etching operations are performed on the lower electrode 20 in order to prevent a situation in which a short circuit S occurs between the upper electrode 10' and the lower electrode 20' and a coverage failure Cf of the upper electrode 10' occurs.

In order to perform the method of manufacturing the resonator package according to the present description as described above, an operation of preparing the hardmask HM, the lower electrode 20, the piezoelectric layer 40, and the insulating layer 50 may be first performed. The above-mentioned operation of preparing the hardmask HM, the lower electrode 20, the piezoelectric layer 40, and the insulating layer 50 is illustrated in FIGS. 5A and 6.

Thereafter, a first etching operation of the hardmask HM of patterning the hardmask HM into a shape to be patterned on the lower electrode 20 using a first etching gas G1 may be performed. As such, the reason that the hardmask HM is patterned is to pattern the lower electrode 20 using the hardmask HM as a medium, because the lower electrode 20 is formed of ruthenium and it is difficult to etch the lower electrode 20 using the soft mask SM.

That is, because the hardmask HM may be patterned by the etching using the soft mask SM1, the hardmask HM may be first patterned and the lower electrode 20 may be then patterned using the patterned hardmask HM.

In other words, according to one example of a first etching operation of the hardmask HM, the hardmask HM may be patterned by a pattern of the soft mask SM1 provided on the hardmask HM.

According to an example of the present description, the patterning of two or more times for the lower electrode 20 using the hardmask HM may be provided so that a reverse slope shape that forms when the hardmask HM is used, is not formed. The above-mentioned first etching operation of the hardmask HM is illustrated in FIG. 5B.

In addition, the first etching gas G1 may be provided as a gas that etches only the hardmask HM and hardly etches the lower electrode 20.

In other words, the first etching operation of the hardmask HM of the method for manufacturing the resonator package according to the present description may be performed using the first etching gas G1 that does not etch the lower electrode 20 and only etches the hardmask HM.

Meanwhile, after the first etching operation of the hardmask HM, a first etching operation of the lower electrode 20 of performing an etching process on the lower electrode 20 may be performed. In this example, a second etching gas G2 that easily etches the lower electrode 20 and only slightly etches the hardmask HM may be used.

That is, the first etching operation of the lower electrode 20 of the method for manufacturing the resonator package may be performed using the second etching gas G2 that does not etch the hardmask HM and etches only the lower electrode 20.

In addition, in the first etching operation of the lower electrode 20, the etching may be performed on only a predetermined thickness of the lower electrode 20, not the overall thickness of the lower electrode 20. Thus, when viewed in a cross section direction of the lower electrode 20, the lower electrode 20 may be formed to include the step portion having the step shape.

This is to induce a shape of the normal slope (NS), in order to prevent the reverse slope (RS) from being formed on the lower electrode 20 by the second etching gas G2.

The above-mentioned first etching operation of the lower electrode 20 is illustrated in FIG. 5C.

If the first etching operation of the lower electrode 20 is completed, the second etching operation of the hardmask HM of again performing the etching for the hardmask HM may be performed.

The second etching process on the hardmask HM may be performed by again providing the soft mask SM2 on one surface of the hardmask HM and spraying the first etching gas G1.

In other words, the second etching operation of the hardmask HM may be performed using the first etching gas G1 that does not etch the lower electrode 20 and etches only the hardmask HM.

In this example, in the second etching operation of the hardmask HM, the hardmask HM may be secondarily patterned by a pattern of the soft mask SM2 provided on the hardmask HM.

The above-mentioned second etching operation of the hardmask HM is illustrated in FIG. 5D.

After completing the second etching of the hardmask HM, the second etching operation of the lower electrode 20 of performing the second etching process on the lower electrode 20 may be performed. Since the lower electrode 20 is formed to include the step portion in the first etching operation of the lower electrode 20, if the second etching gas G2 is sprayed at the same flow rate, the lower electrode 20 may maintain a stepped shape even while the piezoelectric layer 40 is etched to be exposed. Because an edge portion of a thickness changed portion of the stepped portion is more etched, a normal slope (NS) may be further formed in addition to a step portion SP along the edge of the hardmask HM.

That is, the second etching operation of the lower electrode 20 may be performed using the second etching gas G2 that does not etch the hardmask HM and only etches the lower electrode 20.

The above-mentioned second etching operation of the lower electrode 20 is illustrated in FIG. 5E.

Thereafter, an operation of forming a dielectric layer 30 is performed in 660. Referring to the example illustrated in FIG. 5F, the dielectric layer 30 is formed on the lower electrode 20 of which the etching is completed according to FIG. 5E.

Figure 5G:
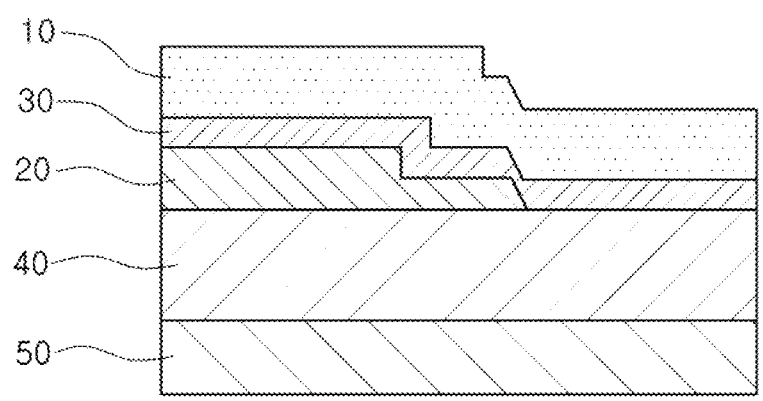

After the operation of forming the dielectric layer 30, an operation of forming an upper electrode 10 is performed in 670. Referring to the example illustrated in FIG. 5G, the upper electrode 10 is finally formed on the dielectric layer 30.

In an example in which the resonator package is manufactured as described above, the short circuit S between the upper electrode 10 and the lower electrode 20 may be prevented, proved by experimentation.

That is, in a case in which an electrostatic discharge (ESD) experiment result is checked after the resonator package has been manufactured by the method described above, when the resonator package is manufactured according to the related art, the failure due to the short circuit S occurs at a rate of about 50% at a voltage of 300V. However, after an improvement according to the present disclosure, the short circuit S occurs at a rate of about 1% even at a higher voltage of 500V, which proves a significant effect.

As set forth above, according to an example of the present description, the resonator package and the method for manufacturing the same may prevent a short circuit from occurring between the upper electrode and the lower electrode that serve as a capacitor.

Further, the coverage failure of the upper electrode may be prevented.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a resonator package, the method comprising:
    etching a lower electrode with a hardmask into at least two portions having different thicknesses;
    depositing a dielectric layer on the etched lower electrode on the at least two portions with different thicknesses,
    wherein only a portion of an upper surface of the lower electrode is etched to shape the lower electrode to have the at least two portions with different thicknesses, and
    wherein the etching of the lower electrode comprises:
    performing a first hardmask etching process on the hardmask provided on the upper surface of the lower electrode to obtain a first etched hardmask;
    performing a first electrode etching process on the lower electrode using the first etched hardmask such that only a portion of the upper surface of the lower electrode is etched;
    performing a second hardmask etching process on the first etched hardmask to obtain a second etched hardmask; and
    performing a second electrode etching process on the first etched lower electrode using the second etched hardmask.

2. The method of claim 1, wherein the lower electrode is etched at least twice with the hardmask patterned into at least two shapes.

3. The method of claim 1, wherein the performing of the first hardmask etching process on the hardmask and the performing of the second hardmask etching process on the first etched hardmask are performed using a first etching gas that does not etch the lower electrode and etches only the hardmask.

4. The method of claim 1, wherein the first electrode etching process and the second electrode etching process are performed using a second etching gas that does not etch the hardmask and etches only the lower electrode.

5. The method of claim 1, wherein during the first hardmask etching process and the second hardmask etching process, the hardmask is patterned by a soft mask provided on the hardmask.

6. The method of claim 1, wherein, during the etching of the lower electrode, the lower electrode is etched by performing at least two dry etching operations with the hardmask patterned in at least two different shapes.

7. A method of manufacturing a resonator package, the method comprising:
    disposing an insulating layer on a substrate;
    disposing a piezoelectric layer on the insulating layer;
    disposing a lower electrode comprising two portions having different thicknesses directly on an upper surface of the piezoelectric layer,
    disposing a dielectric layer directly on an upper surface of the lower electrode and directly on a sidewall of the lower electrode; and
    disposing an upper electrode directly on an upper surface of the dielectric layer, wherein the disposing of the lower electrode comprises etching the lower electrode with a hardmask patterned into two different shapes so that the upper surface of the lower electrode is etched to shape the two portions of the lower electrode having different thicknesses, and the etching of the lower electrode comprises:

performing a first hardmask etching process on a hardmask disposed on the upper surface of the lower electrode to obtain a first etched hardmask;

performing a first electrode etching process on the lower electrode using the first etched hardmask so that only a portion of the upper surface of the lower electrode is etched;

performing a second hardmask etching process on the first etched hardmask to obtain a second etched hardmask; and performing a second electrode etching process on the first etched lower electrode using the second etched hardmask.

8. The method of claim 7, wherein the performing of the first hardmask etching process on the hardmask and the performing of the second hardmask etching process on the first etched hardmask are performed using a first etching gas that does not etch the lower electrode and etches only the hardmask.

9. The method of claim 7, wherein the first electrode etching process and the second electrode etching process are performed using a second etching gas that does not etch the hardmask and etches only the lower electrode.

10. The method of claim 7, wherein during the first hardmask etching process and the second hardmask etching process, the hardmask is patterned by a soft mask disposed on the hardmask.

11. The method of claim 7, wherein during the etching of the lower electrode, the lower electrode is etched by performing at least two dry etching operations with the hardmask patterned into two different shapes.

12. The method of claim 7, wherein the first hardmask etching process, the first electrode etching process, the second hardmask etching process, the second electrode etching process, the disposing of the dielectric layer directly on the upper surface of the lower electrode and directly on the sidewall of the lower electrode, and the disposing of the upper electrode directly on the upper surface of the dielectric layer are performed in this order.

13. The method of claim 7, wherein an upper surface of a thinner portion of the two portions of the first electrode is substantially parallel to an upper surface of a thicker portion of the two portions of the first electrode.

* * * * *